(12) United States Patent
Yang et al.

(10) Patent No.: US 8,226,179 B2
(45) Date of Patent: Jul. 24, 2012

(54) HOUSING WITH HOOK CONFIGURATION

(75) Inventors: Kuo-Chang Yang, Taipei Hsien (TW); Yi-Wen Wei, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 253 days.

(21) Appl. No.: 12/699,828

(22) Filed: Feb. 3, 2010

(65) Prior Publication Data

US 2010/0320883 A1    Dec. 23, 2010

(30) Foreign Application Priority Data

Jun. 19, 2009  (CN) .......................... 2009 1 0303461

(51) Int. Cl.
*A47B 81/00* (2006.01)
(52) U.S. Cl. .................. 312/223.2; 312/263; 312/265.5
(58) Field of Classification Search ............... 312/223.2, 312/216, 217, 222, 263, 265, 265.5; 292/251.5
See application file for complete search history.

(56) References Cited

U.S. PATENT DOCUMENTS

| | | | | |
|---|---|---|---|---|
| 5,996,831 A * | 12/1999 | Teok | ........................... | 292/251.5 |
| 6,125,040 A * | 9/2000 | Nobuchi et al. | ............ | 312/223.2 |
| 6,157,532 A * | 12/2000 | Cook et al. | ................. | 312/223.2 |
| 6,929,291 B2 * | 8/2005 | Chen | ........................... | 292/251.5 |
| 7,438,333 B2 * | 10/2008 | Wu et al. | ..................... | 292/251.5 |
| 7,791,879 B2 * | 9/2010 | Jiang et al. | ..................... | 312/325 |
| 7,984,935 B2 * | 7/2011 | Luo et al. | ................... | 312/223.1 |
| 2008/0179895 A1 * | 7/2008 | Lin | ............................. | 292/251.5 |

\* cited by examiner

*Primary Examiner* — Hanh V Tran
(74) *Attorney, Agent, or Firm* — Altis Law Group, Inc.

(57) ABSTRACT

A housing comprises a first outer shell, a second outer shell; and a hook configuration configured for assembling the first outer shell on the second outer shell. The hook configuration comprises two clasp units set in the first outer shell. Each of the two clasp units comprises a first clasp body and a first magnet. Two hook units are set in the second outer shell. Each of the two hook units comprises a first hook and a second magnet.

8 Claims, 6 Drawing Sheets

HOUSING WITH HOOK CONFIGURATION

BACKGROUND

1. Technical Field

The present disclosure relates to a housing with a hook configuration.

2. Description of Related Art

Generally, an electronic device includes a first outer shell and a second outer shell, and a hook configuration for assembling the first outer shell to the second outer shell to form a housing for receiving a plurality of electronic elements. When users want to repair the electronic elements, they must use force to separate the two shells. This can cause damage to one shell or the other, or possibly destroy the housing of the electronic device rendering it unusable.

Therefore, what is needed is a housing with a hook configuration to overcome the described shortcoming.

DETAILED DESCRIPTION

Figure 1:
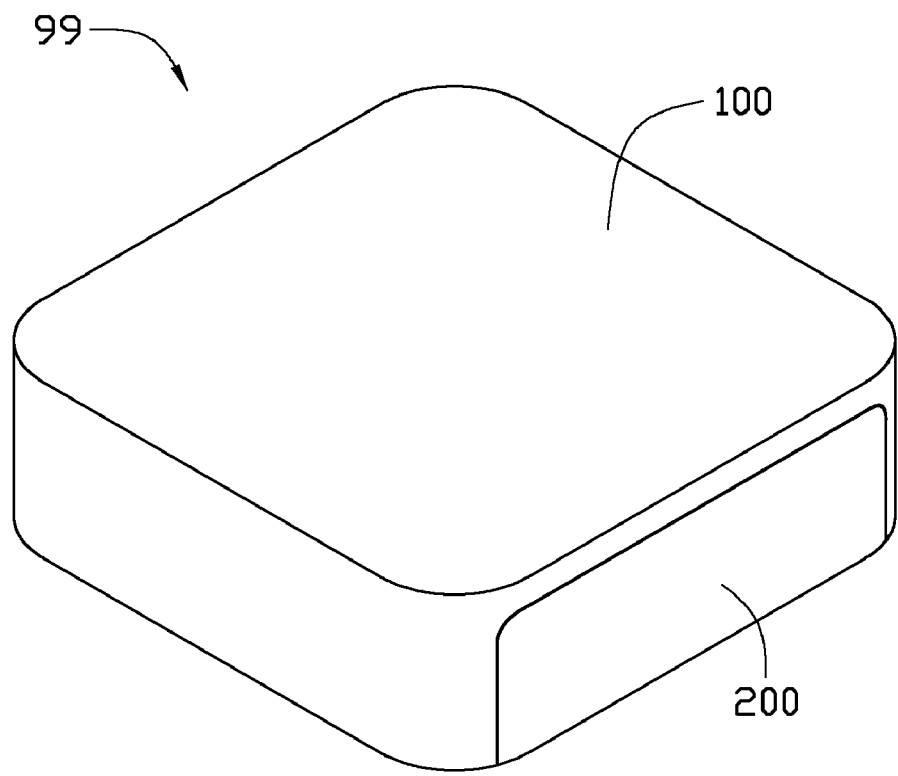
FIG. 1 is an isometric view of a housing in accordance with an exemplary embodiment.
Figure 2:
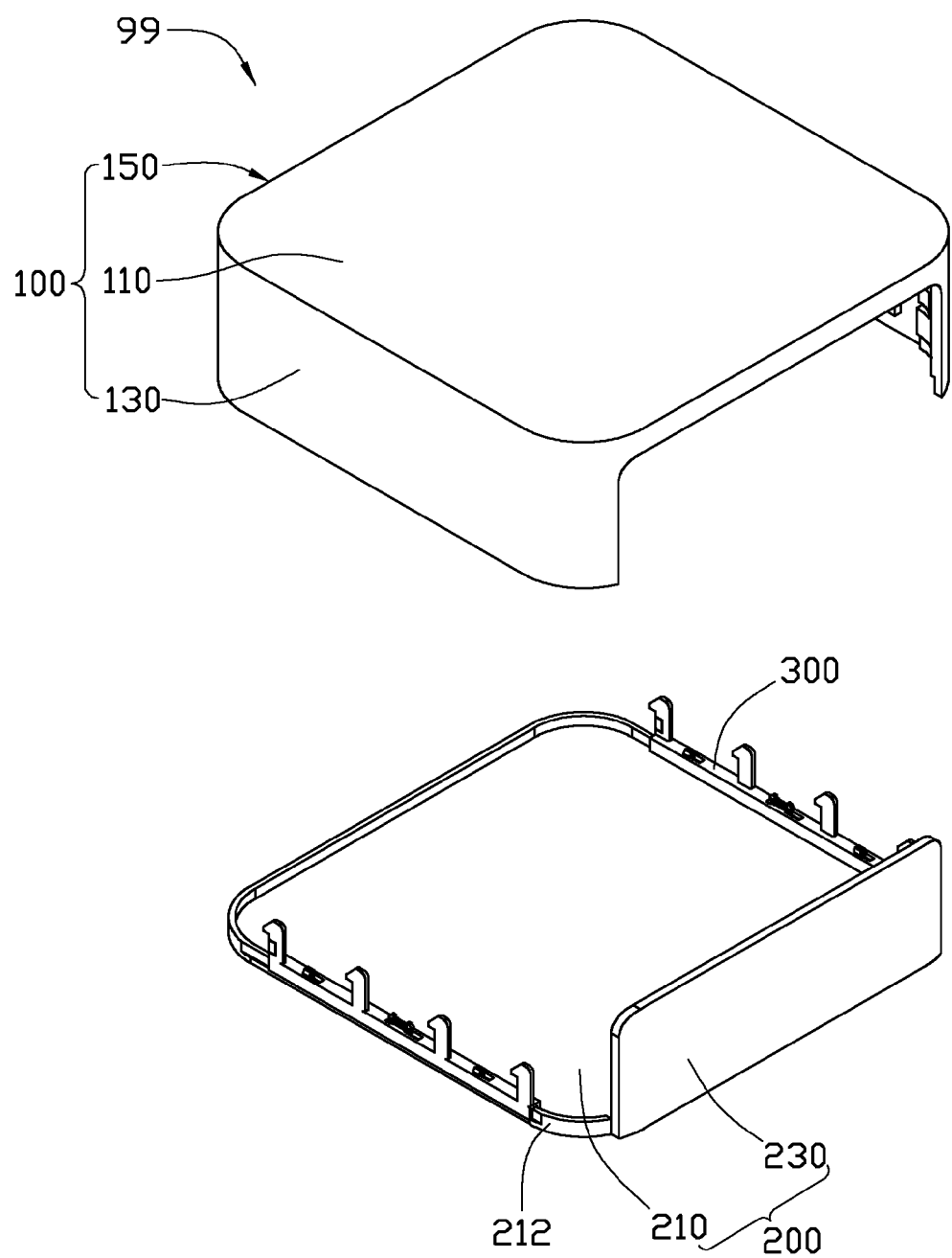
FIG. 2 is a partially exploded view of the housing of FIG. 1.
Figure 3:
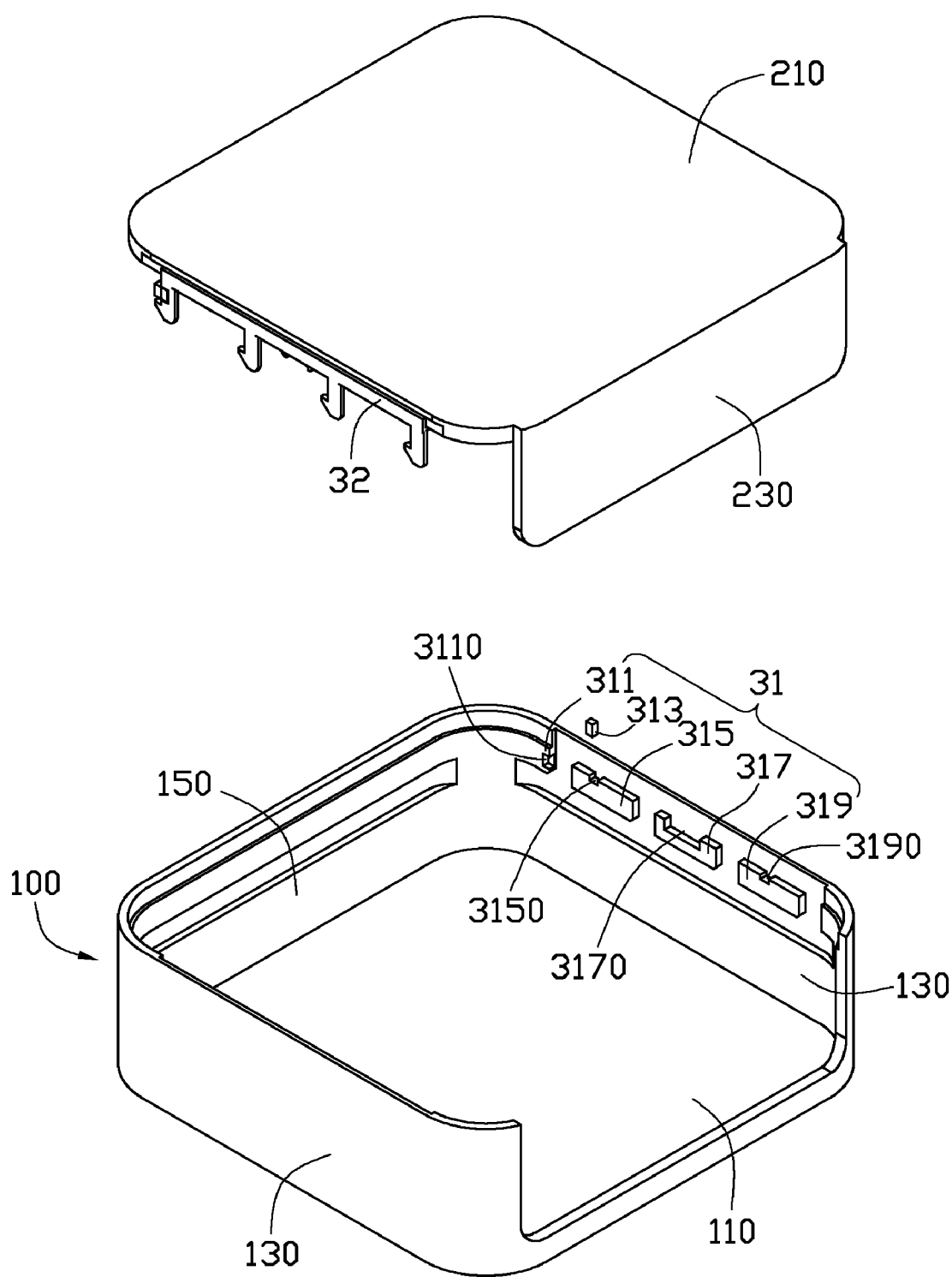
FIG. 3 is a partially exploded view of the housing of FIG. 1, viewed from another aspect.

Referring to FIGS. 1-3, a housing 99 is provided. The housing 99 includes a first outer shell 100, a second outer shell 200, and a hook configuration 300. The hook configuration 300 is configured for assembling the first outer shell 100 to the second outer shell 200. The first outer shell 100 cooperates with the second outer shell 200 to form the housing 99 for receiving a plurality of electronic elements (not shown). In the exemplary embodiment, the housing 99 can be the housing of a computer, a DVD player, etc.

The first outer shell 100 includes a first rectangular substrate 110, two side plates 130, and a connection plate 150. The two side plates 130 are extended from two opposite edges of the first substrate 110, and the connection plate 150 is extended from one edge of the first substrate 110 and perpendicular to the two opposite edges of the first substrate 110.

Figure 4:
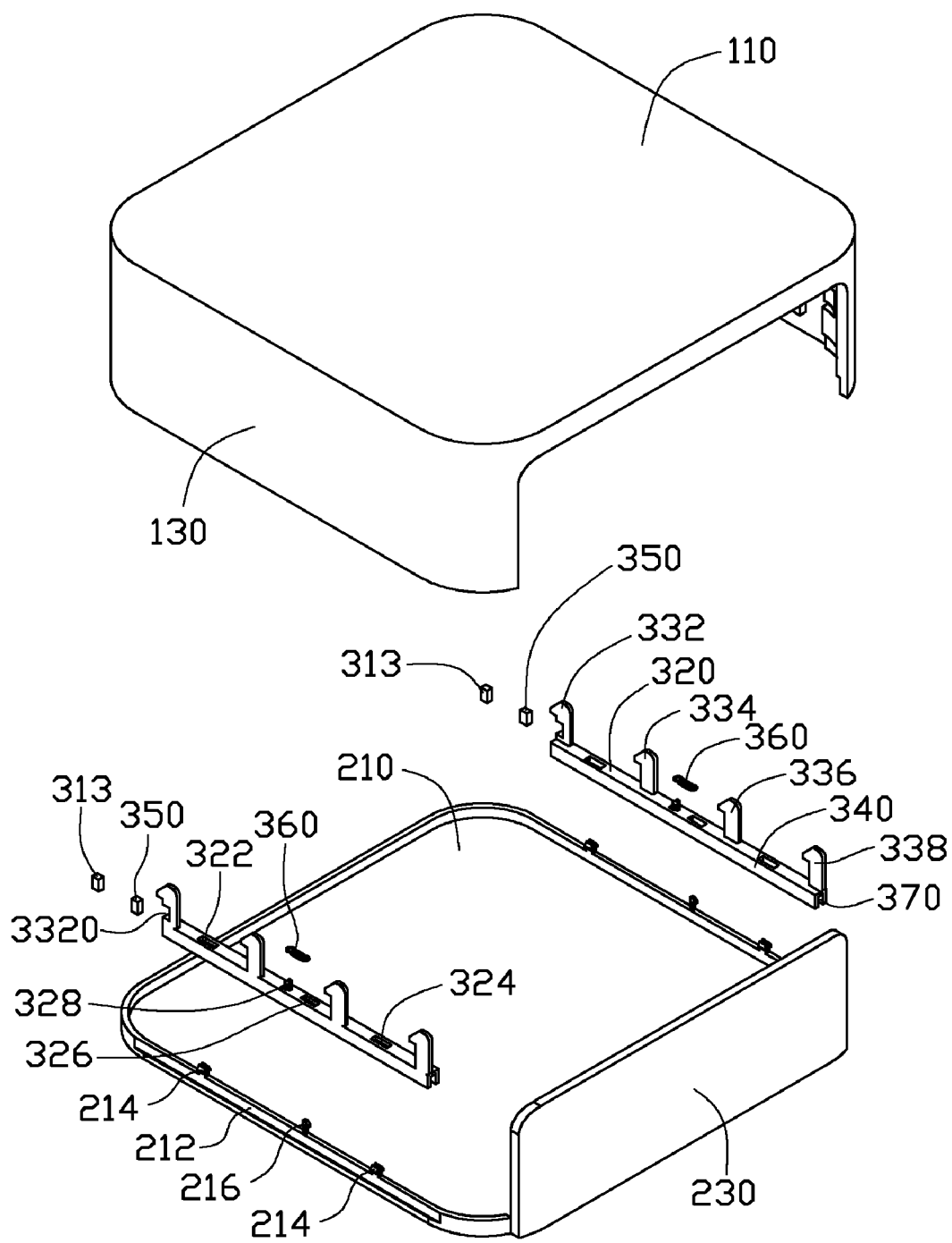
FIG. 4 is an exploded view of the housing of FIG. 3.

The second outer shell 200 includes a second substrate 210 and a cover plate 230. The cover plate 230 is extended from one side of the second substrate 210. The second substrate 210 is rectangular, and includes two opposite flanges 212 which are connected to two opposite ends of the cover plate 230. Referring to FIG. 4, two hook bodies 214 and a first hook portion 216 are extended from each of the two opposite flanges 212. The first hook portion 216 is located between the two hook bodies 214.

The hook configuration 300 includes two clasp units 31 set in the first outer shell 100 and two hook units 32 slidably fixed to the second outer shell 200. The two clasp units 31 are set in the two side plates 130 respectively. Each of the two clasp units 31 includes a first clasp body 311, a first magnet 313, a second clasp body 315, a third clasp body 317, and a fourth clasp body 319. The first, second, third and fourth clasp bodies (311, 315, 317 and 319) are arranged in a beeline. A first containing portion 3110 is set in one side of the first clasp body 311 adjacent to the second clasp body 315. The magnet 313 is contained in the first containing portion 3110. A first receiving groove 3150 is defined in one side of the second clasp body 315 away from the first substrate 110, a second receiving groove 3170 is defined in one side of the third clasp body 317 away from the first substrate 110, and a third receiving groove 3190 is defined in one side of the fourth clasp body 319 away from the first substrate 110.

In the exemplary embodiment, the first, second, third and fourth clasp bodies (311,315,317 and 319) are integrally formed on two side plates 130 respectively. In another embodiment, the first, second, second, third and fourth clasp bodies (311,315,317 and 319) can be fixed to the two side plates 130 by jointing.

Referring to FIG. 4, each of the two hook units 32 includes a main body 320, a first hook 332, a second hook 334, a third hook 336, a fourth hook 338, two positioning plates 340, a second magnet 350 and a spring 360. The first, second, third, and fourth hooks (332,334,336 and 338) are vertically extended from one side of the main body 320. The two positioning plates 340 are vertically extended from the main body 320 to sandwich each of the two opposite flanges 212. The extension direction of the first, second, third and fourth hooks (332,334,336 and 338) are opposite to the extension direction of the two positioning plates 340. The two positioning plates 340 cooperate with the main body 320 to form a U shaped sliding groove 370. The first, second, third and fourth hooks (332,334,336 and 338) are arranged in a beeline. A second containing portion 3320 is defined in the first hook 332. The second magnet 350 is contained in the second containing portion 3320.

A first through hole 322, a second through hole 324, a perforation 326, and a second hook portion 328 are defined in the main body 320. The first through hole 322 is located between the first hook 332 and the second hook 334, and the second through hole 324 is located between the third hook 336 and the fourth hook 338, and the perforation 326 and the second hook portion 328 are located between the second hook 334 and the third hook 336. The length of the first through hole 322 and the second through hole 324 exceeds that of the hook body 214 respectively. The length of the perforation 326 exceeds that of the first hook portion 216.

When assembling, firstly, the first magnet 313 of the two clasp units 31 is mounted in the first containing portion 3110 of the first clasp body 311, and the second magnet 350 of the two hook units 32 is mounted in the second containing portion 3320 of the first hook 332. Secondly, the two flanges 212 of the second substrate 210 are inserted into the two sliding grooves 370 of the two hook units 32, thereby driving the two hook units 32 to slide relative to the second outer shell 200. The two hook bodies 214 of the two flanges 212 are extended through the first through hole 322 and the second through hole 324 of the two flanges 212 respectively, and are engaged with the main body 320, and the first hook portion 216 of the two flanges 212 is extended through the perforation 326. Finally, the two ends of the two springs 360 are placed over the first hook portion 216 and the second hook portion 328 respectively. After being completely assembled, the two hook units 32 are fixed to the second outer shell 200.

Figure 5:
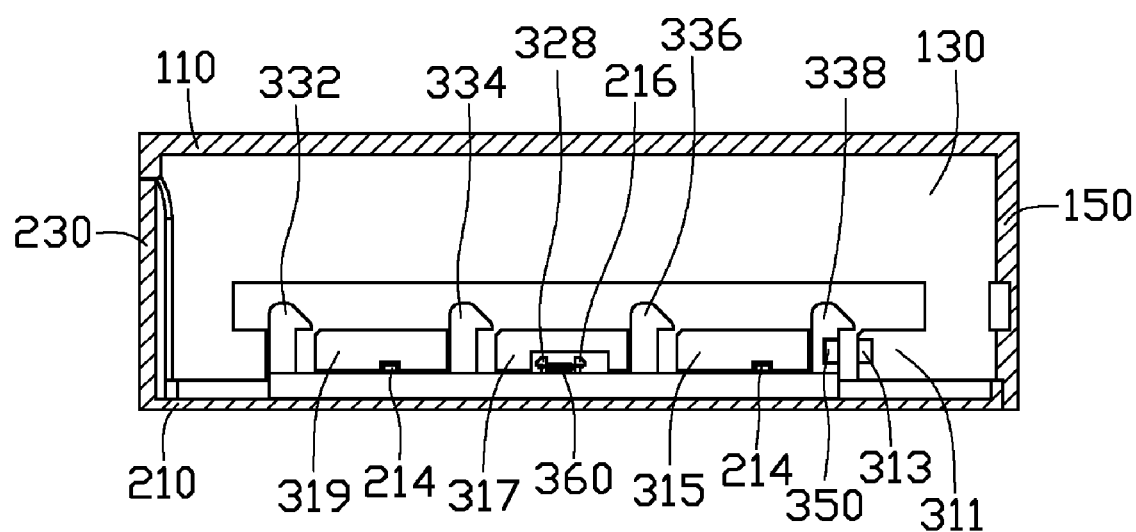
FIG. 5 is a cross-sectional view of the housing of FIG. 1 in one state.
Figure 6:
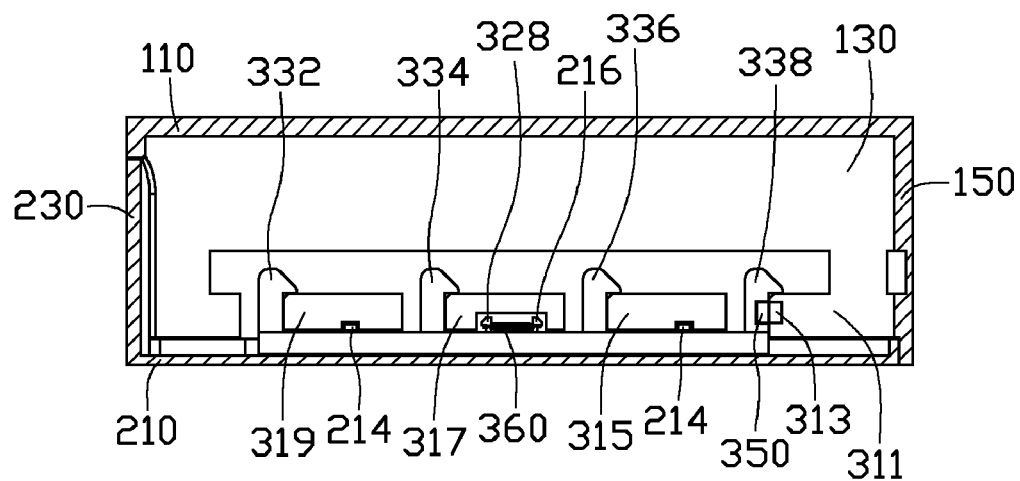
FIG. 6 is a cross-sectional view of the housing of FIG. 1 in another state.

Referring to FIGS. 5-6, if the first outer shell 100 is located on the second outer shell 200, and the two side plates 130 of the first outer shell 100 are adjacent to the two flanges 212 of the second substrate 210 on the second outer shell 200. The two hook bodies 214 of the two flanges 212 are received in the first receiving groove 3150 of the second clasp body 315 and the third receiving groove 3190 of the fourth clasp body 319.

The first hook portion 216, the second hook portion 328 and the spring 360 connecting between the first hook portion 216 and the second hook portion 328 are contained in the second receiving groove 3170 of the third clasp body 317. The first magnet 313 and the second magnet 350 are positioned parallel to each other, and two parallel surfaces of the first magnet 313 and the second magnet 350 have opposite polarities to generate an attraction force to attract the second magnet 350 to move, thereby driving the two hook units 32 to slide relative to the second outer shell 200, and driving the first, second, third and fourth hooks (332,334,336, and 338) to move to engage with the first, second, third and fourth clasp bodies (311,315,317 and 319) respectively. The two springs 360 are stretched by the second hook portion 328 to generate an elastic deformation. The first outer shell 100 cooperates with the second outer shell 200 to form the housing 99.

If the user wants to disassemble the first outer shell 100 from the second outer shell 200, the user must exert an exterior force to push the second outer shell 200 away from the first outer shell 100. The two hook units 32 are forced to move relative to the first outer shell 100 by the movement of the second outer shell 200, thereby driving the first, second, third and fourth hooks (332, 334,336 and 338) to separate from the first, second, third, and fourth clasp bodies (311,315,317 and 319) respectively. The two springs 360 rebound to drive the two hook units 32 to recoil, thereby separating the first outer shell 100 from the second outer shell 200.

Although the present disclosure has been specifically described on the basis of the embodiments thereof, the disclosure is not to be construed as being limited thereto. Various changes or modifications may be made to the embodiments without departing from the scope and spirit of the disclosure.

What is claimed is:

1. A housing comprising:
    a first outer shell;
    a second outer shell; and
    a hook configuration configured for assembling the first outer shell on the second outer shell, and the hook configuration comprising:
        two clasp units set in the first outer shell, and each of the two clasp units comprising a first clasp body and a first magnet mounted in the first clasp body; and
        two hook units set in the second outer shell, and each of the two hook units, corresponding to one of the two clasp units, comprising a first hook and a second magnet mounted in the first hook;
        wherein two parallel surfaces of each of the first magnets and the corresponding second magnet have opposite polarities to generate an attracting force, the two hook units move relative to the second outer shell by the attracting force, and drive the first hook to move to engage with the corresponding first clasp body; and
        wherein, when the second outer shell is pushed by an exterior force to move relative to the first outer shell, each of the first magnets is separated from the corresponding second magnet, and the first hook is driven by a movement of the second outer shell to separate from the first clasp body.

2. The housing as described in claim 1, wherein a sliding groove is defined in each of the two hook units, and two flanges are defined in the second outer shell, and the two sliding grooves are placed over the two flanges, thereby driving the two hook units to slide relative to the second outer shell.

3. The housing as described in claim 2, wherein each of the two hook units comprises a main body and two positioning plates vertically extended from the main body to sandwich one of the two flanges, the first hook is vertically connected to the main body respectively, and the first hook and the two positioning plates are located at two opposite sides of the main body, and the main body cooperates with the two positioning plates to form the sliding groove.

4. The housing as described in claim 3, wherein at least one hook body is defined in the second outer shell, at least one through hole is defined in the main body; and the at least one hook body is extended through the at least one through hole, engaged with the main body, and is slidable in the at least one through hole.

5. The housing as described in claim 3, wherein a first hook portion is defined in the second outer shell, a second hook portion and a perforation are formed in the main body; the first hook portion is extended through the perforation, and is slidable in the perforation; and the hook unit further comprises at least one spring, and two ends of the at least one spring are placed over the first hook portion and the second hook portion.

6. The housing as described in claim 3, wherein the hook unit further comprises a second hook, a third hook and a fourth hook vertically extended from the main body, and the clasp unit further comprises a second clasp body, a third clasp body and a fourth clasp body, which correspond to the second hook, the third hook and the fourth hook, respectively.

7. The housing as described in claim 6, wherein the first clasp body, the second clasp body, the third clasp body and the fourth clasp body are arranged in a beeline, and are set in the first outer shell.

8. The housing as described in claim 2, wherein the first outer shell comprises a first substrate and two side plates perpendicularly extending from the two opposite sides of the first substrate, and the second outer shell comprises a second substrate, and the two clasp units are set in the two side plates respectively, and the two hook units are set on two opposite flanges of the second substrate, and correspond to the two clasp units.

* * * * *